United States Patent
Ohtsuka

(10) Patent No.: US 7,765,510 B2
(45) Date of Patent: Jul. 27, 2010

(54) METHOD OF SEARCHING FOR WIRING ROUTE INCLUDING VIAS IN INTEGRATED CIRCUIT

(75) Inventor: Ikuo Ohtsuka, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 279 days.

(21) Appl. No.: 12/068,034

(22) Filed: Jan. 31, 2008

(65) Prior Publication Data

US 2008/0209384 A1 Aug. 28, 2008

(30) Foreign Application Priority Data

Feb. 26, 2007 (JP) .............................. 2007-045916

(51) Int. Cl.
*G06F 17/50* (2006.01)
(52) U.S. Cl. ............................... 716/13; 716/8; 716/12; 716/14; 716/15; 716/16
(58) Field of Classification Search ...................... 716/8, 716/12–16
See application file for complete search history.

(56) References Cited

U.S. PATENT DOCUMENTS

| | | | | |
|---|---|---|---|---|
| 5,500,804 A | * | 3/1996 | Honsinger et al. | 716/16 |
| 5,831,867 A | * | 11/1998 | Aji et al. | 716/4 |
| 6,737,351 B2 | | 5/2004 | Ogawa et al. | |
| 7,067,919 B2 | | 6/2006 | Watanabe et al. | |
| 7,272,810 B2 | * | 9/2007 | Orita | 716/10 |
| 7,302,662 B2 | * | 11/2007 | Lee et al. | 716/9 |
| 7,373,628 B1 | * | 5/2008 | Balsdon et al. | 716/13 |
| 7,451,429 B2 | * | 11/2008 | Ikeuchi | 716/19 |
| 7,464,348 B1 | * | 12/2008 | Lockman et al. | 716/2 |
| 7,574,685 B1 | * | 8/2009 | Dong et al. | 716/11 |
| 2006/0048088 A1 | * | 3/2006 | Nakano | 716/12 |
| 2006/0101367 A1 | * | 5/2006 | Fujita et al. | 716/10 |
| 2007/0162882 A1 | * | 7/2007 | Ueda | 716/13 |

FOREIGN PATENT DOCUMENTS

| | | |
|---|---|---|
| JP | 1-137373 | 5/1989 |
| JP | 2003-197623 | 7/2003 |

\* cited by examiner

*Primary Examiner*—Naum B Levin
(74) *Attorney, Agent, or Firm*—Staas & Halsey LLP

(57) ABSTRACT

A wiring design device for an integrated circuit has been disclosed, which is capable of easily changing a via to a redundant via in a route for which search has been completed but which has been found to be changed after the design has advanced and of easily obtaining an optimum solution of a route even if the via is changed to the redundant via. The wiring design device for an integrated circuit comprises an evaluation value calculation circuit that calculates an evaluation value for each of a plurality of wiring routes from a start node to an end node, a determination circuit that determines a wiring route from the start node to the end node based on the calculated evaluation value, and a via type selection circuit that selects a via type to be used according to a difference between line widths of wires, wherein the evaluation value calculation circuit calculates, as to a wiring route in which a via is provided, the evaluation value after the via is provided by calculating a plurality of the evaluation values when different via types are used.

10 Claims, 15 Drawing Sheets

FIG.2

| | COST COEFFICIENT OF DISTANCE IN MAIN DIRECTION Dm | COST COEFFICIENT OF DISTANCE IN SUB DIRECTION Ds | COST COEFFICIENT OF STANDARD VIA vC | COST COEFFICIENT OF REDUNDANT VIA rvC | COST COEFFICIENT OF WIRING RULE VIOLATION Ecost |
|---|---|---|---|---|---|
| CS1 | 1 | 3 | 2 | | 0 |
| CS2 | 1 | 3 | 2 | | 6 |
| ... | ... | ... | ... | | ... |
| CSn | 1 | 2 | 3 | | ~∞ |

$$cost = a*Dm + b*Ds + c*vC + d*rvC + \ldots + e*Ecost \quad \ldots (1)$$

FIG. 3
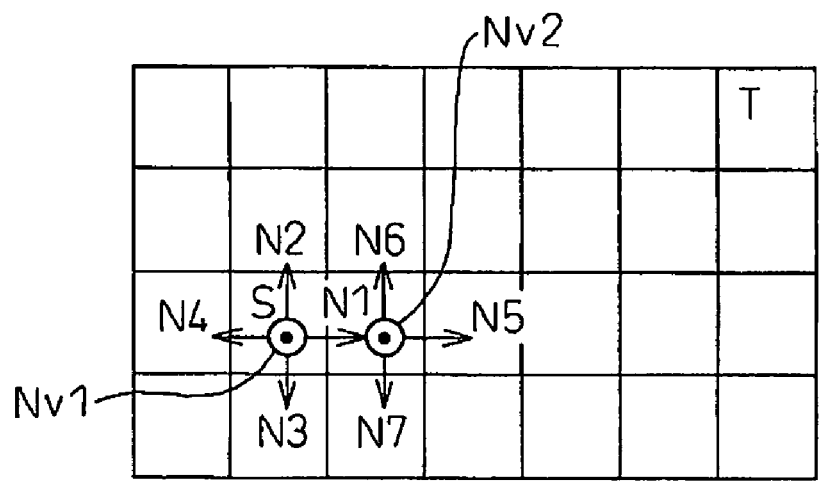
mD=1
sD=3
vC=2
(detour=1)
(fold=1)
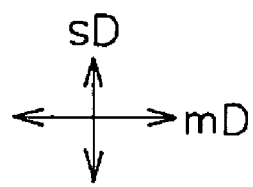

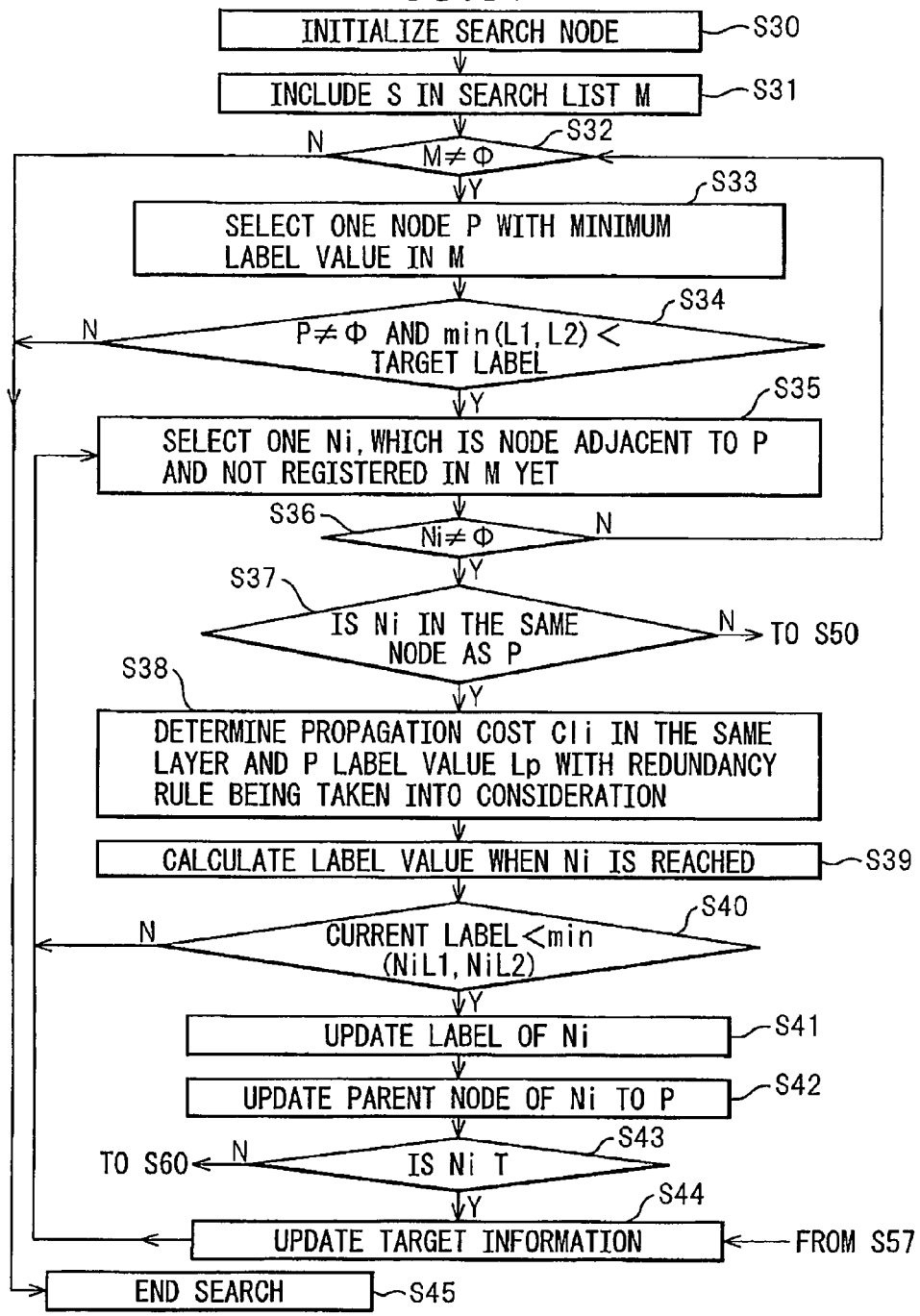

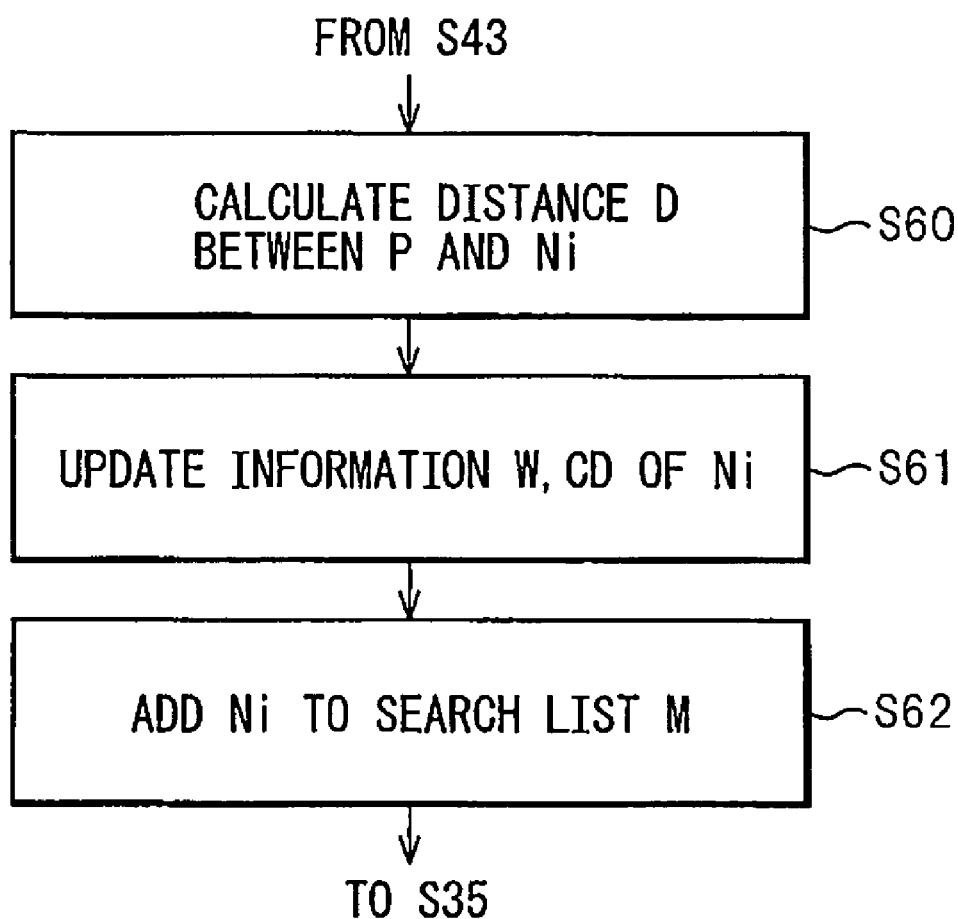

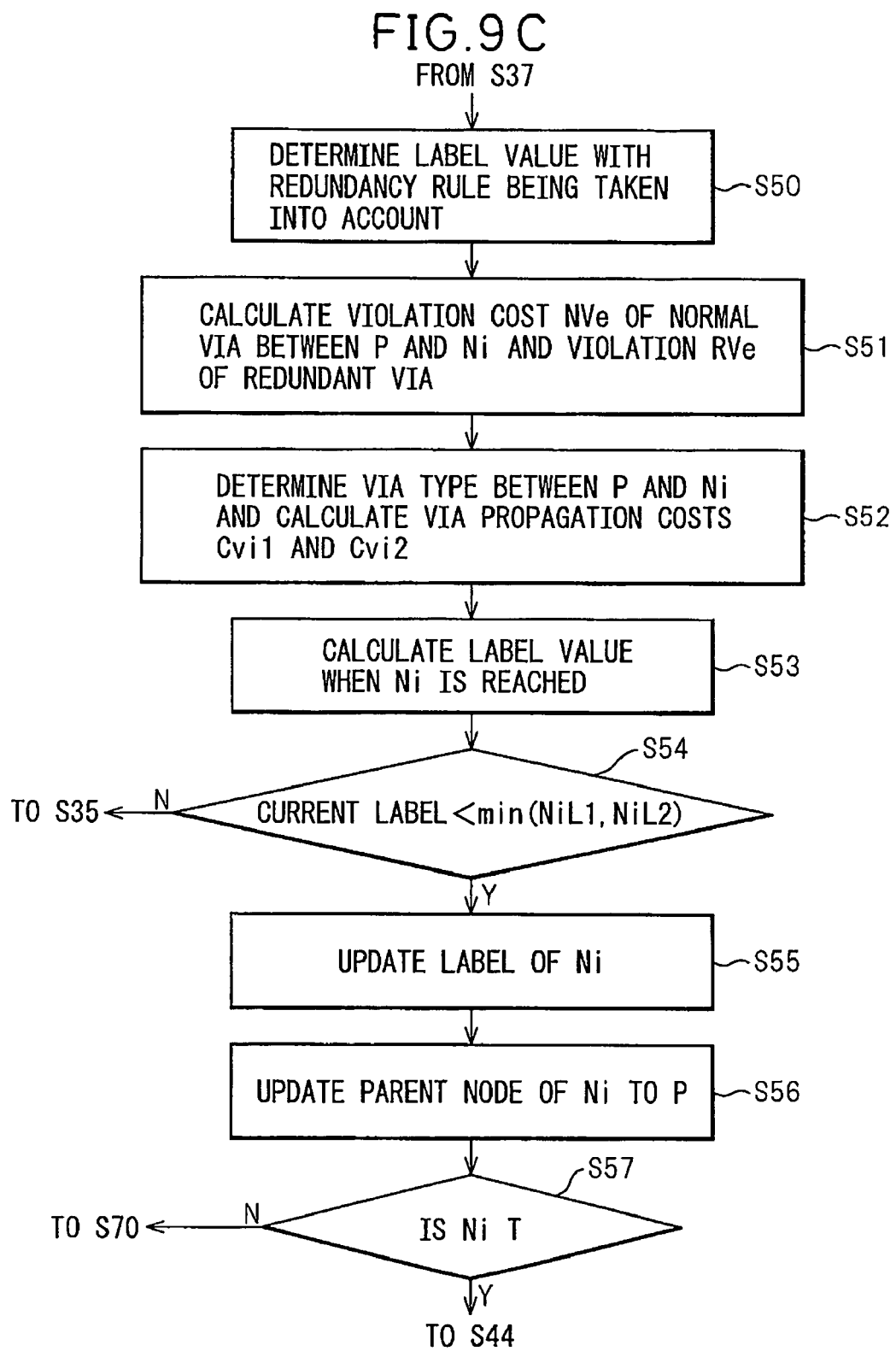

FIG.13

FROM S22

S90: RECORD WIRE WIDTH OF CURRENT POSITION cN AS CURRENT WIRE WIDTH. RECORD DISTANCE FROM POSITION AT WHICH WIDTH IS DIFFERENT FROM STANDARD WIRE WIDTH IN CD.

S91: cN ≠ Φ, AND PARENT NODE pN OF cN ≠ Φ

S92:
```
if(cN AND pN ARE IN THE SAME LAYER) {
      CREATE ROUTE IN THE SAME LAYER FROM cN TO pN ;
      ADD DISTANCE BETWEEN cN AND pN TO CD ;
      WHEN CD EXCEEDS RANGE OF RESTRICTION OF
      REDUNDANCY, UPDATE CURRENT WIRE WIDTH TO
      STANDARD WIDTH OF LAYER ;
}else{
      if(THERE IS MARK INDICATIVE THAT REDUNDANT
      VIA CONNECTION IS FIXED IN cN) {
            CREATE REDUNDANT VIA ;
      }else{
            FIND GAP BETWEEN PATTERN WIDTH Vc ON cN
            SIDE OF STANDARD VIA BETWEEN cN AND pN
            AND CURRENT WIRE WIDTH AND SET IT AS ΔW ;
            if(ΔW≧REDUNDANT VIA RULE THRESHOLD
            VALUE AND CURRENT WIRE WIDTH≧Vc) {
                  CREATE REDUNDANT VIA ;
            }else{
                  CREATE STANDARD VIA ;
            }
      }
      COMPARE WIDTH ON pN LAYER SIDE OF CREATED
      VIA AND STANDARD WIRE WIDTH OF pN LAYER AND
      RECORD THICKER ONE AS CURRENT WIRE WIDTH ;
      UPDATE CD TO 0 ;
}
```

S93: pN==source

S94: UPDATE cN TO pN

END

METHOD OF SEARCHING FOR WIRING ROUTE INCLUDING VIAS IN INTEGRATED CIRCUIT

CROSS-REFERENCE TO RELATED APPLICATION

This application is based upon and claims priority from prior Japanese patent Application No. 2007-045916, filed on Feb. 26, 2007, the entire contents of which are incorporated herein by reference.

BACKGROUND OF THE INVENTION

The disclosed technique relates to a method of searching for a wiring route in an integrated circuit, an automatic wiring device for an integrated circuit, and a program that causes a wiring design device for an integrated circuit to operate, and more specifically, to a method, a device, and a program for carrying out an automatic wiring layout in an integrated circuit having a plurality of wire layers.

Semiconductor integrated circuits have been developed to a higher integration level with an increased number of layers, and design thereof, automatic wiring layout processing is carried out using an integrated circuit wiring design function of a CAD device. The automatic wiring layout process searches for an optimum route from a start node to an end node on a layout plane.

FIG. 1 is a diagram showing an example of layout processing. In FIG. 1, an optimum route from a start node 1 to an end node 2 is searched for and obstacles 3 are provided between the start node 1 and the end node 2, and a route is formed by avoiding these obstacles. There are three routes: a first route is a route from the start node 1 to the end node 2 via a wire 4 in a first layer, a wire 5 in a second layer, and a wire 6 in the first layer; a second route is a route from the start node 1 to the end node 2 via a wire 7 in the first layer, a wire 8 in the second layer, and a wire 9 in the first layer; and a third route is a route from the start node 1 to the end node via a wire 10 in the second layer, a wire 11 in the first layer, a wire 12 in the second layer, a wire 13 in the first layer, a wire 14 in the second layer, a wire 15 in the first layer, and a wire 16 in the second layer. A via (cut) is used to connect wires in different layers. In the first and second routes, the number of vias is small (two cuts), but the wire length is long. On the other hand, in the third route, the wire length is short, but the number of vias is large (eight cuts).

In order to select a route at the lowest cost, setting is made so that different loads (costs) are imposed according to selected nodes and the cost for each possible route is calculated. FIG. 2 is a diagram showing an example of a cost series and cost calculation formula. In the example in FIG. 2, the distance in the main direction, the distance in the sub direction, the number of standard vias, the number of redundant vias, the wiring rule violation, etc., are defined as a cost factor and their respective cost coefficients are Dm, Ds, vC, rvC, Ecost. A value of each element is found as to each wire CSn from the start node 1 to the end node 2 and its cost is calculated according to calculation formula (1). For example, when a node in the opposite direction of a target node is selected, the wire length becomes longer and the cost is increased, and although not shown schematically, the number of wire folds will be a cost factor and cost increases as the number of wire folds increases. Further, a setting is made so that when an interruption is made into a node already occupied, the cost is increased. In the case where there are a plurality of wire layers, wires in different layers are connected by a via as shown schematically; however, the number of vias will be a cost factor and cost increases as the number of vias increases. Vias include a standard via, one having a predetermined size is provided, and a redundant via to be described later, and the cost coefficients thereof are different.

FIG. 3 is a diagram for explaining a method of searching for a route from a start node S to an end (target) node T in the same layer. Nodes adjacent to start node S include two nodes in main directions mD, i.e., N1 and N4, two nodes in sub directions sD, that is, N2 and N3, and a node in a via direction vC, i.e., Nv1, and any one of them can be selected as a course. For each course, each load (cost) coefficient is determined and in the figure, the course in main direction mD has a cost coefficient of 1, the course in sub direction sD has a cost coefficient of 3, and the course in via direction vC has a cost efficient of 2, and further, a cost coefficient of 1 is added to a detour (selection of a course in the opposite direction) and a fold (change in the direction of course). Under the condition of the cost coefficients as described above, the total of the cost coefficients is found for each possible route from start node S to target node T and a route at the lowest cost is selected. In FIG. 3, nodes are set by dividing the target region into the form of a lattice, however, in practice, the form is not required to be a lattice and the next node is set immediately before an obstacle is encountered, and thus the processing time can be shortened.

When the calculation of a route search is actually made, a route is extended sequentially in various directions from start point S. According to the above cost coefficients, the cost of each route is calculated as each route extends and the cost is represented by a label value. A route having the minimum label value is selected from among the plurality of routes and extended, and the cost increases as the routed is extended, and therefore, each route is extended sequentially despite of somewhat differences and a route that reaches the end (target) node will be a route at the lowest cost. The method of searching for a route is described in Japanese Unexamined Patent Publication (Kokai) No. H1-137373 etc., and therefore, detailed explanation is omitted here.

U.S. Pat. Nos. 7,067,919 and 6,737,351 describe that in the wire that uses a via in an integrated circuit, a phenomenon called stress migration occurs and a via wire is broken. The stress migration (SMig (SM)) is a phenomenon unique to a copper wire, in which copper in a via (bottom) disappears due to the heat in a high temperature shelf test, a thermal cycle test, or a process and a void develops. FIG. 4A to FIG. 4C are diagrams for explaining the stress migration. As shown in FIG. 4A, when heat is applied to a structure in which wires 21 and 22 provided in different layers are connected by a cut 23, a void 24 develops at a contact part between the cut 23 and the wire 21 as shown in FIG. 4B. The stress migration is thought to be caused by the diffusion of vacancies due to the specificity of thermal stress (drive force) and is more likely to occur in a combination of a thick wire and a small-diameter cut.

In order to avoid wire breakage due to stress migration, when wiring in an integrated circuit is designed, a rule called a MinimumCut rule is established. Specifically, when a via is provided in a range of a fixed distance from a thick conductor (wire, via metal, terminal) for connection between different layers, two or more minimum vias normally used are provided for a more redundant connection than that by the minimum via. For example, as shown in FIG. 4C, when a thin wire 32 to be connected to a thick wire 33 and a thick via is connected to a thin wire 31 through a via, it is necessary to make a thicker via that connects the wires 31 and 32. FIG. 5 is a diagram explaining an example of a redundant via according to the MinimumCut rule. When a thin wire 42 is extended from a thick conductor (wire, via metal, terminal) 41 and connected with a wire in a different layer using a cut 45, if a distance D from the thick conductor 41 to the cut is shorter than a predetermined distance, a via metal extension part 44 is provided at the end part of the wire 43 and a cut 46 is added to provide a redundant via. Due to this, the occurrence of wire breakage by the stress migration can be suppressed. A redundant via means a via having two or more cut parts, or a structure in which two or more normal one-cut vias are arranged side by side.

In a multilayer LSI wire layer configuration, normally, the lower layers have a fine pitch and the upper layers have a coarser pitch. In addition, it is general that there is a difference by a factor of two at most between the minimum wire widths and the wire track pitches between neighboring wires. However, depending on the design, there may be a case where a difference by a factor of four arises between the standard wire widths between neighboring layers. In such a case, it may happen that the cut size of a via that connects the upper two layers of successive three wire layers differ from that of another via that connects the lower two layers by a factor of four, both vias connecting the successive three layers, and accompanying this, there occurs a gap of a factor of four between the sizes of lids (=via metal) that each cover the cut of the via.

For example, in an LSI in which a wire layer is configured by six layers M1 to M6, it is assumed that the standard wire width is 1 and the standard wire width of M6 is 4. Then, a state is brought about, in which the cut diameter of a via that connects wire layers is determined in accordance with the thicker wire layer side and therefore the cut diameter between M5 and M6 is about the same as the wire width 4 and M4 and M5 is connected by a cut having a small width of about 1. If M5 is focused on here, its form will be such that the wire having a standard width of 1 and the lid (=via metal) having a thick width of 4 are present on the continuous conductor. If it is assumed here that the threshold value of the gap of width according to the MinimumCut rule is equal to or more than 3 ($\geq 3$) and the range of distance from the position of the thick width to which restrictions are applied is infinite, then the restriction of a redundant via arises for the above-mentioned form.

SUMMARY OF THE INVENTION

The MinimumCut rule is also applied to the conventional automatic wiring system. In the automatic wiring system, in a procedure of propagating the cost (evaluation value) from a node to another node, the evaluation value of a node is calculated by determining which wire or via is used to fill each node and then the next via is reached; however, when the MinimumCut rule is applied, it becomes apparent that the node previously evaluated through the minimum via should have been in fact evaluated through the redundant via when a conductor that uses a large-diameter via or a thick conductor is searched for and connected. In other words, the part for which the processing has already been completed and which has been thought to be fixed is not completed and an "error" is found. In conventional automatic wiring system, the part at which an error has occurred cannot be recovered automatically and if such a search is continued with an underestimated route cost, the minimum cost route in the section cannot be found and therefore it is not possible to optimize the wiring route therebetween.

The point of this problem is explained by returning to FIG. 1. In FIG. 1, the first route from start node 1 to end node 2 via wire 4 in the first layer, wire 5 in the second layer, and wire 6 in the first layer is selected normally because of the short wire length and low cost. In the first route, a part 17 that connects wire 11 and wire 12 is formed as a standard via; however, if a part 18 that connects wire 12 and wire 13 is formed as a thick via, a restriction will be imposed later that part 17 be formed as a redundant via. If it is possible to change part 17 into a redundant via no problem will arise; however, if obstacle 3 is present adjacent to part 17 as shown in FIG. 1, the insertion of a redundant via will cause a short circuit. In the case of the conventional automatic wiring system, even in such circumstances, the cost when part 17 is passed by is underestimated (short circuit is not considered), and therefore, it is erroneously recognized as a minimum cost route. As described above, when the MinimumCut rule is applied, the result will be that the third route that causes a wiring error at a portion at which a redundant via is formed and therefore should not be selected originally is selected and the first or second route that should be selected originally is not selected but discarded.

The embodiment to be disclosed is to realize a method of searching for a wiring route in an integrated circuit, a wiring design device for an integrated circuit, and a program capable of easily changing a via to a redundant via in a route for which search has been completed but which has been found to be changed after the design has advanced and of easily obtaining an optimum solution of a route even if the via is changed to the redundant via.

In the embodiment described here, at a point on the way in search for a route, both a cost on the assumption that a minimum via is used and a cost on the assumption that a redundant via is used are held and thus an underestimated state is eliminated. Then, when a large-diameter via is used in search for a route and if it is found that the via used immediately before has to be a redundant one, the route cost on the assumption of the use of a redundant via is adopted. Due to this, it is possible to evaluate the cost of a node to be passed by with a proper value, preventing an underestimated value.

Because of this, it is possible to realize a method of searching for a wiring route in an integrated circuit, a wiring design device for an integrated circuit, and a program capable of obtaining an optimum wiring route while observing the MinimumCut rule that suppresses the occurrence of breakage owing to the stress migration (SM).

BRIEF DESCRIPTION OF THE INVENTION

The features and advantages of the invention will more clearly understood from the following description taken in conjunction with accompanying drawings, in which:

FIG. 2 is a diagram for explaining a cost series and a cost calculation formula in processing of searching for a minimum cost route.

FIG. 3 is a diagram for explaining a search for a minimum cost route.

FIGS. 9A to 9D are flowcharts of processing of searching for a minimum cost route in an embodiment.

FIG. 13 is a flowchart of processing of creating a wiring route from a target node to a start node via a parent node.

DESCRIPTION OF THE PREFERRED EMBODIMENTS

Figure 1:
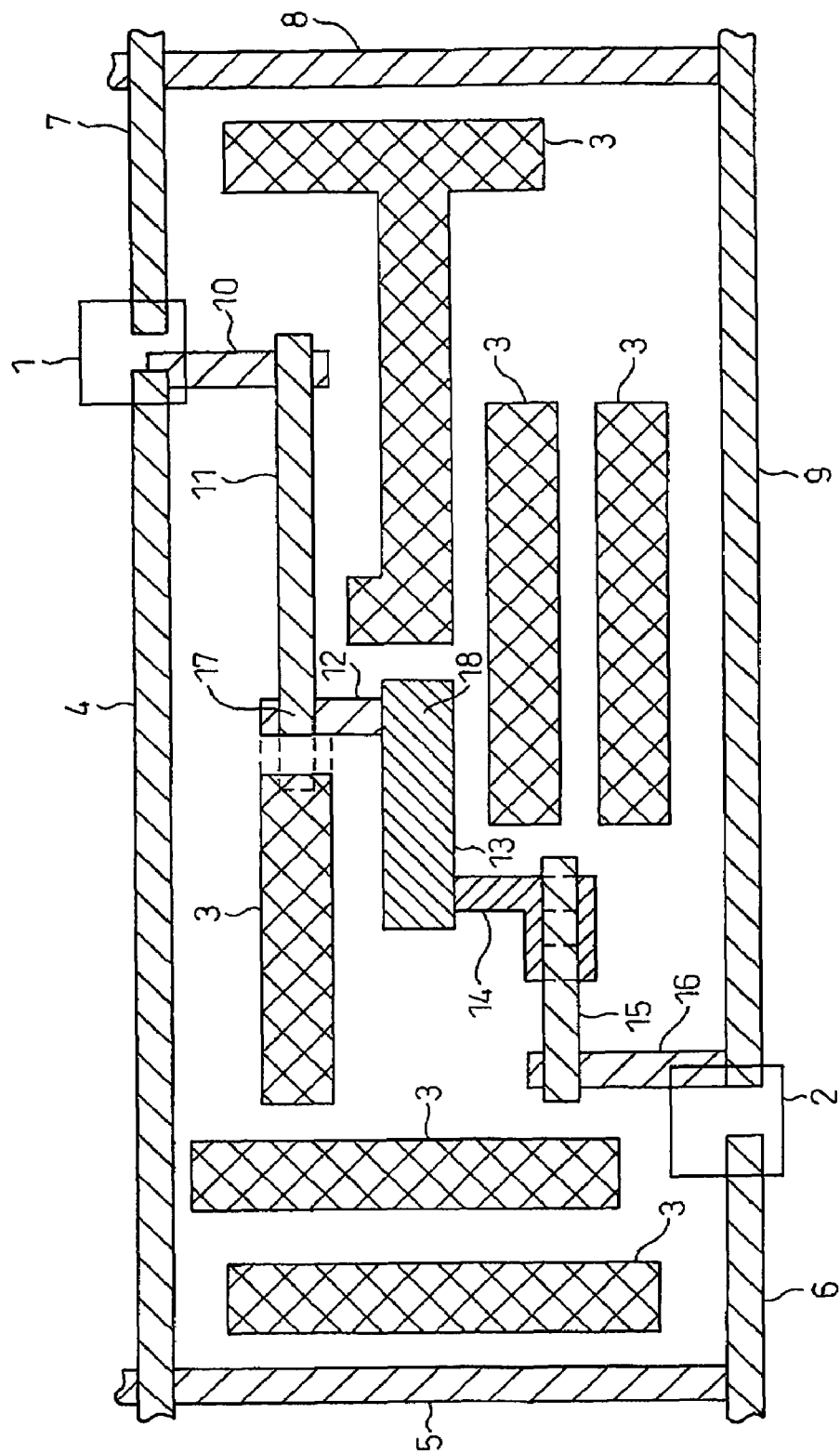
FIG. 1 is a diagram for explaining a search for a minimum cost route.
Figure 4A:
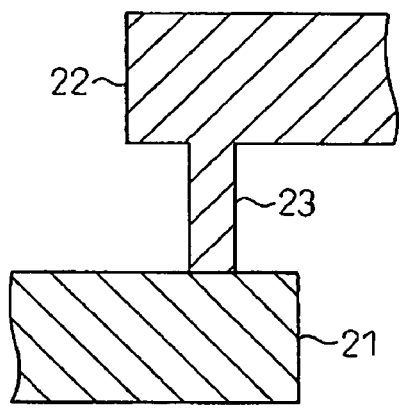
FIGS. 4A to 4C are diagrams for explaining stress migration.
Figure 4B:
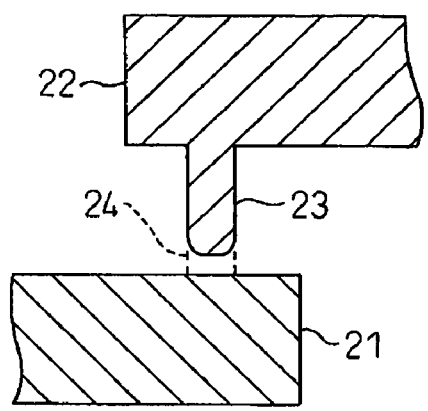
Figure 4C:
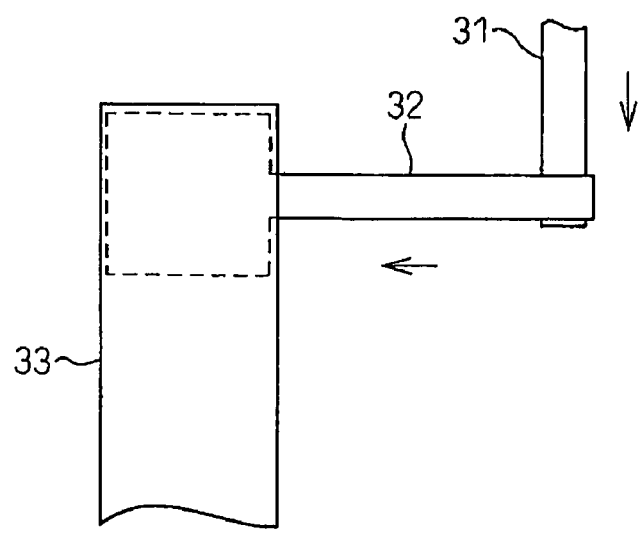
Figure 5:
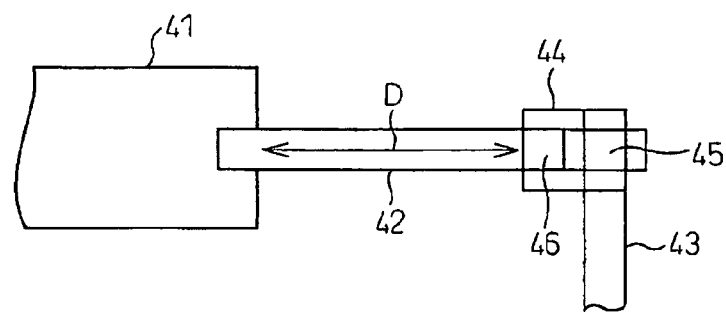
FIG. 5 is a diagram for explaining the setting of a redundant via.
Figure 6:
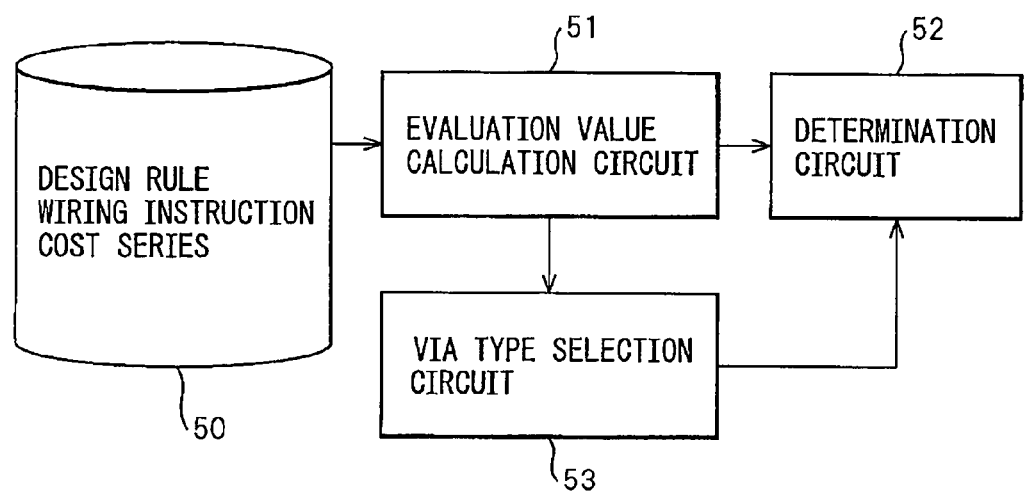
FIG. 6 is a block diagram showing a configuration of an automatic wiring device for an integrated circuit in an embodiment.

FIG. 6 is a block diagram showing a configuration of an automatic wiring device for an integrated circuit in an embodiment. As shown in FIG. 6, the automatic wiring device for an integrated circuit in the embodiment is an automatic wiring device for an integrated circuit comprising an evaluation value calculation circuit 51 that calculates an evaluation value for each of a plurality of wiring routes from a start node to an end node based on design rules, wiring instructions, cost series, etc., stored in a storage device 50, a determination circuit 52 that determines a wiring route from the start node to the end node based on the calculated evaluation value, and a via type selection circuit 53 that selects a via type to be used according to a difference between line widths of wires, wherein the evaluation value calculation circuit 51 calculates the evaluation value of a wiring route to be provided with a via after the via is provided simultaneously together with a plurality of the evaluation values when different via types are used.

Further, there may be a case where a rule is provided that the restriction of redundant via connection is not imposed at a position a fixed distance apart from a thick conductor in order to improve the design efficiency by limiting the range of the stress migration (SM) measures. In order to deal with the rule, until a (current) target node in search is reached, information about whether the wire width changes finally and how distant from a node reached through a via is held. Alternatively, a flag may be used indicative of whether a fixed distance is apart.

In the embodiment, when a large-diameter via is used in search, it is possible to determine whether or not there is a portion in a range of distance according to the MinimumCut rule at which evaluation of redundant via cost is necessary and an evaluation value to be adopted. Alternatively, by causing each node to have a flag indicative of being a fixed distance apart from a large-scale node, it becomes apparent whether or not the restriction of redundant via should be imposed and the cost (evaluation value) to be adopted can be determined when the next destination of propagation is a node where a via is necessary.

The route cost is thus propagated and when a target (end) node is reached, a route is created by tracing reversely from the reached target node to the origin of propagation. By creating a route while checking for a portion at which redundant via connection is necessary between nodes when tracing, it is possible to realize an optimum wiring route that observes the MinimumCut rule.

The embodiment aims at a method of searching for a wiring route in an integrated circuit using a CAD device realized in the form of an LSI design CAD device and a CAD device that enables execution of the method in the embodiment, that is, a wiring design device for an integrated circuit, and a program installed in the CAD device so as to carry out the designing method in the embodiment.

Figure 7:
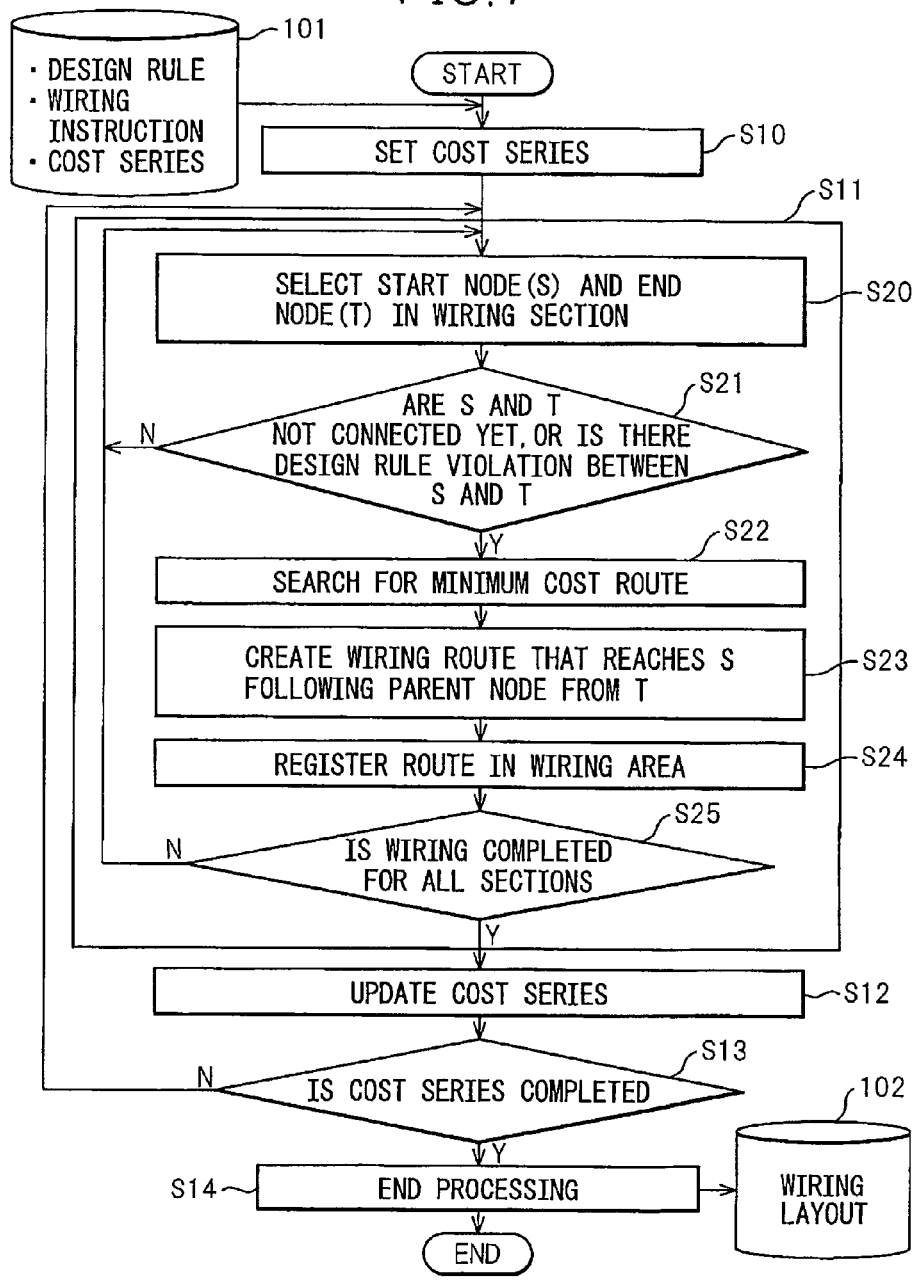
FIG. 7 is a total flowchart of automatic wiring processing in an embodiment.

FIG. 7 is a diagram showing an entire flowchart of processing of searching for a wiring route in an integrated circuit in the embodiment. The processing of searching for a wiring route is carried out based on the design rule, wiring instructions, cost series, etc., stored in a storage device 101. In step S10, a cost series as shown in FIG. 2 is set and a cost for a search for a route is calculated based on the cost calculation formula shown schematically. Step S11 includes steps S20 to S25, in which a search for a wiring route in the entire target region of an integrated circuit is carried out. In step S12, the cost series is updated based on the search result in step S11 and in step S13, whether or not the processing of all of the cost series is completed is determined, and steps S11 to S13 are repeated until completed, and when completed, the procedure advances to step S14, in which the wiring layout, the result of processing, is stored in a storage device 102 and the procedure is ended.

In step S20, start node S and end (target) node T in the wiring section are selected. In step S21, whether start node S and end node T are not connected yet, or whether there is a violation of the design rule between S and T is determined. If S and T are already connected and there is no violation of the rule, the change of the route is not necessary, and therefore, in step S20, the setting for the next wiring target section is initiated. In S21, if it is determined that the target section of setting is not connected yet in S20, the procedure advances to step S22. In S21, if it is determined that there is a violation of the rule in the target section of setting, the route is discarded temporarily and the procedure advances to S22.

In step S22, a route at the minimum cost is searched for between S and T. In step S23, a wiring route from T to S via a parent node is created in the opposite direction to the direction of search. In step S24, the created wiring route is registered in the wiring region. In step S25, whether or not the wiring is completed for all of the sections is determined, and if not, the procedure returns to step S20 and step S11 is repeated until the wiring is completed for all of the sections.

The flowchart of the embodiment differs from the conventional example in the minimum cost route search processing in step S22 and other processing is substantially the same as that of the conventional example.

Before the minimum cost route search processing in step S22 in the flowchart of the embodiment is explained, the minimum cost route search processing of the conventional example is explained for comparison.

Figure 8:
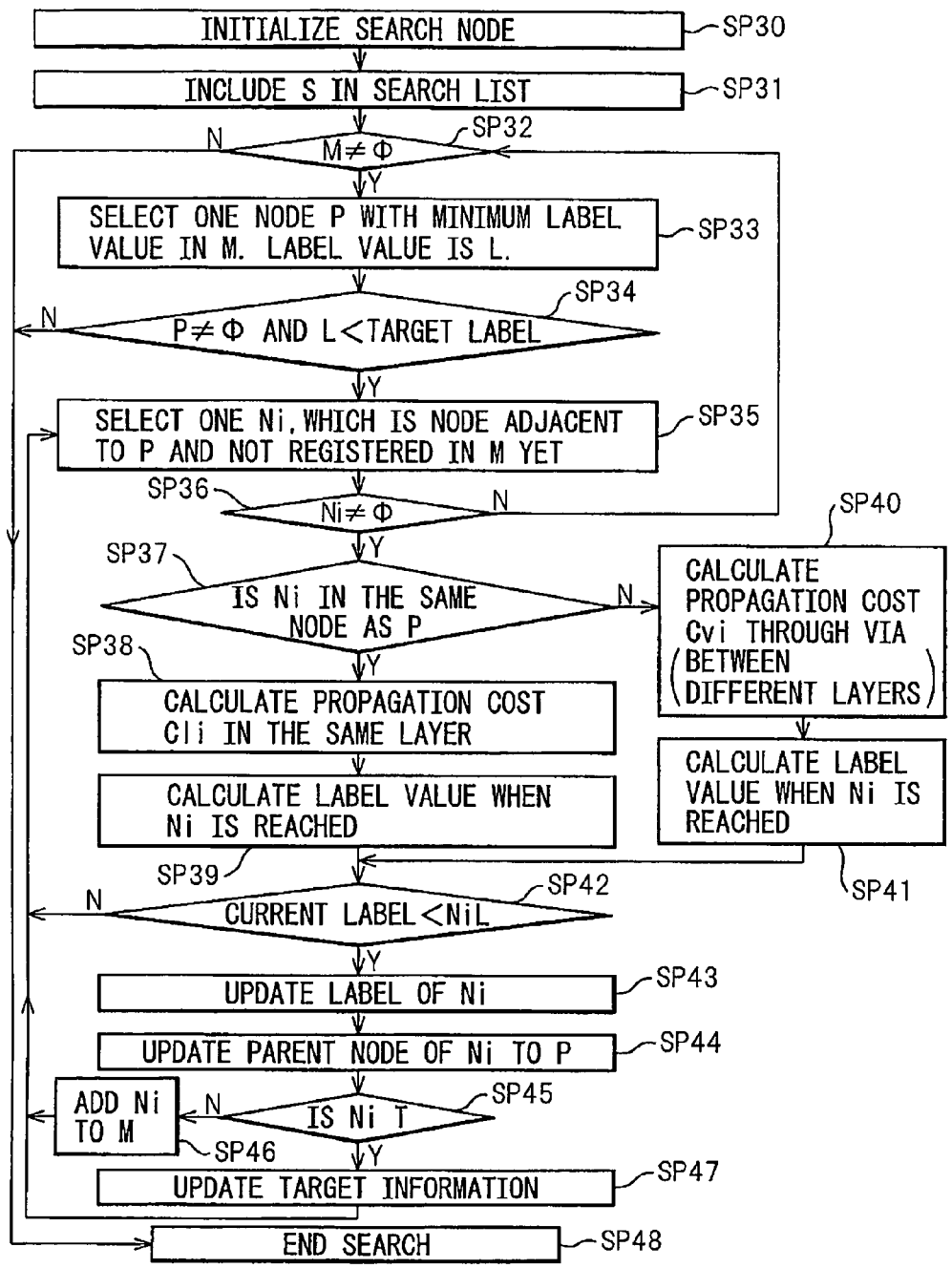
FIG. 8 is a conventional flowchart of processing of searching for a minimum cost route.

FIG. 8 is a flowchart showing the minimum cost route search processing of the conventional example. In step SP30, the initialization of a search node is carried out, in step SP31, start point S is included in a search list M. Due to this, a memory region that stores a route extending from start node S is reserved and it is made possible to generate information about a route connected in the form of a slave node with respect to a parent node (P node). In step SP32, whether or not M is null is determined. If null, the search has already been completed, and therefore, the procedure advances to step SP48 and the search is ended. If not null, the procedure advances to step SP33 and one node P with a minimum label value (L) in list M is taken out. As described above, a plurality of routes are extended from start node S, the destination end of each route is node P, label value L in relation to a cost is set to each node P, and then P with a minimum label value is taken out. Because the label value increases as the route extends, each route is selected sequentially by selecting node P with a minimum label value. In step SP34, whether P is not null (P is present) and label value L is equal to or less than a target level is determined. Due to this, a search for a route with a higher cost than the label value of node T is avoided. When P is null or label value L of P is larger than the label of target node T, no more search is necessary, and therefore, the procedure advances to step SP48 and the search is ended, and in other cases, the procedure advances to step SP35.

In step SP35, one Ni is selected, which is a node capable of extending from node P and not registered in M yet. A node capable of extending from node P is a node located at a distance in the main direction or sub direction with respect to node P, or a node located at a position in the same plane as that of node P in a different layer through a via. By combining these nodes, it is made possible to select a node at a certain distance in the main direction and then at a certain distance in the sub direction. Here, a node capable of extending from node P is referred to as a neighboring node of P. In step SP36, whether Ni is null, that is, whether there is no neighboring node that can be selected is determined, and if Ni is null, the procedure returns to step SP32 and if Ni is not null, the procedure advances to step SP37.

In step SP37, whether or not node Ni and node P are in the same layer is determined and if they are in the same layer, the procedure advances to step SP38 and if not, the procedure advances to step SP40. In step SP38, a cost Cli for the propagation in the same layer is calculated and in step SP39, Cli is added to label value L to node P, a label value (current label) when the route reaches node Ni is calculated, and then, the procedure advances to step SP42.

In step SP40, because of the propagation between different layers through a via, a via propagation cost Cvi is calculated, Cvi is added to label value L to node P in step SP41, a label value (current label) when the route reaches node Ni is calculated, and then the procedure advances to step SP42.

In step SP42, whether or not the current label is smaller than a threshold value NiL of the label scheduled in Ni is determined and if smaller than threshold value NiL, the procedure advances to step SP43 and if equal to or more than threshold NiL, the selection of such a route is not preferable and no more route search is necessary, and therefore, the procedure returns to step SP35. Here, threshold value NiL means a label initial value (∞) of node Ni or a label value attached when another propagation route has passed by Ni previously.

In step SP43, the label value of the route that has reached Ni is updated to the current label and the parent node of Ni is updated to P in step SP44. In step SP45, whether or not current node Ni is target node T is determined and if Ni is not T, the procedure advances to step SP46 and node Ni is added to search list M and then the procedure returns to step SP35 and steps SP35 to SP46 are repeated until Ni becomes target node T. If Ni is T, it means that the route search has reached end node T, and therefore, the label value of target node T is updated in step SP47 and then the procedure returns to step SP35 again. If there is a neighboring node that has not been registered in M among the neighboring nodes of P, it is set to Ni as a propagation candidate in SP 35 and the procedure advances to the determination in step SP37; however, if Ni is null, the procedure advances to SP32 and SP33 and node P that will be a new start point of propagation is taken out. At this time, as a condition of selecting node P, it is required that a node have a label value smaller than the label value when target T described above has been reached previously, and therefore, if there is no node that meets the condition in search list M, the result in SP34 will be negative and the procedure advances to SP48 and the search is ended. By the above-mentioned processing, various routes are extended while the cost is calculated and a route with a minimum cost reaches target node T, and therefore, a route that makes the cost minimum is determined.

In the conventional minimum cost route search processing explained above, the cost when a route is through a via is calculated in steps SP40 and SP41, however, a redundant via is not taken into consideration.

FIG. 9A to FIG. 9D are flowcharts showing the minimum cost route search processing in step S22 in the embodiment. What is different from the conventional processing shown in FIG. 8 is the processing after it is determined that node Ni and node P are in different layers.

Figure 10:
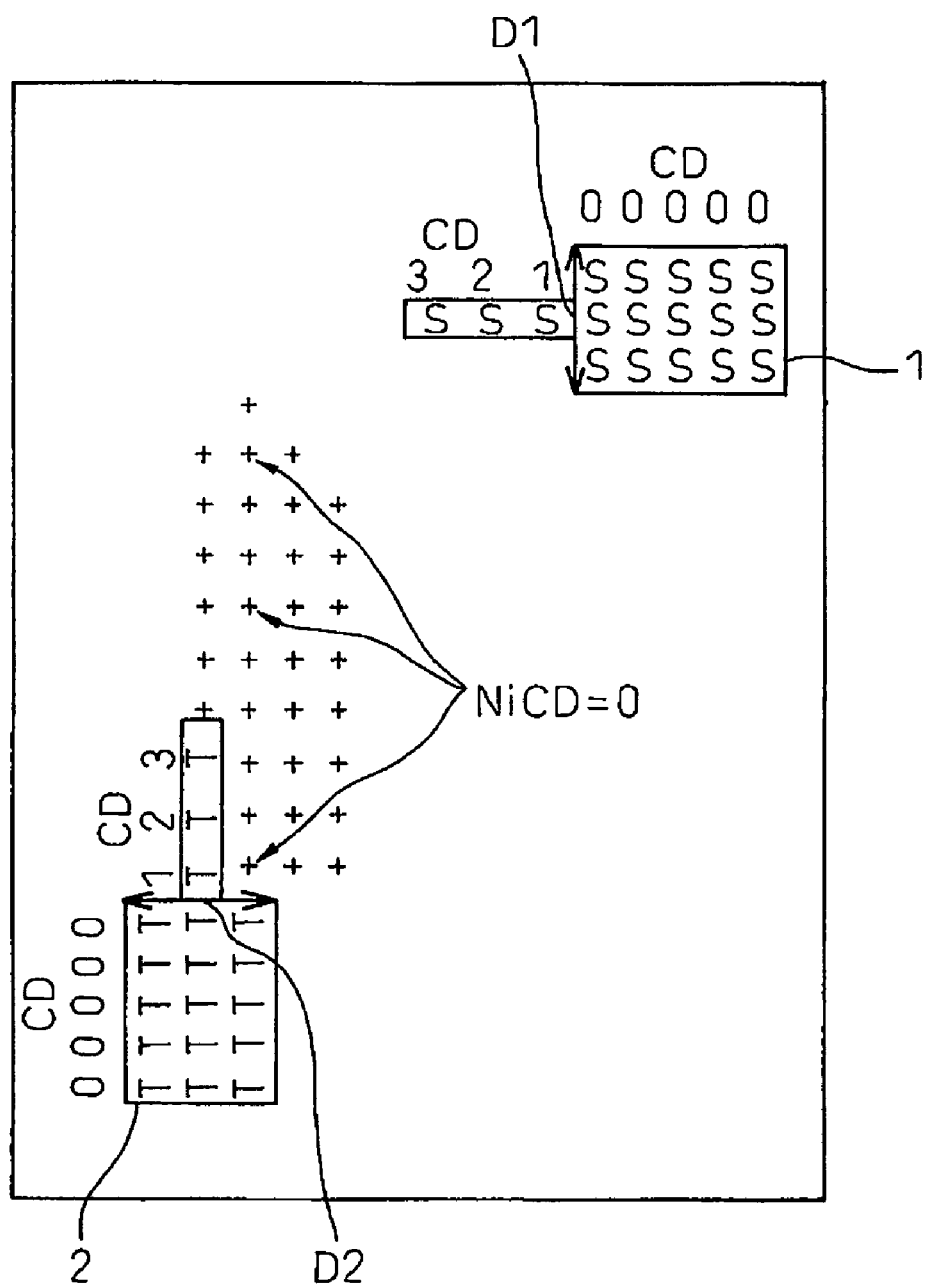
FIG. 10 is a diagram for explaining initialization processing.

In step S30, the initialization of a search node is carried out. FIG. 10 is a diagram for explaining initialization processing. In the initialization processing, for every structural member of search node Ni, an attribute STF, label values L1, L2, a line width W, and a distance CD are set to initial values. In the embodiment, two label values are used for a case where a standard via is used and a case where a redundant via is used. Specifically, when Ni is on a conductor that leads to a start node 1, STF is set to "S" indicative of the start point, L1 and L2 are set to zero, and then, if Ni is on a conductor thicker than a standard line width, W is set to the thicker width and CD is set to zero, and if Ni is on a conductor having the standard line width, W is set to the standard line width and CD is set to a distance from the thicker part. If Ni is on a conductor that leads to an end node 2, STF is set to "T" indicative of a target (end point), L1 and L2 are set to maximum values, and then, if Ni is on a conductor thicker than the standard line width, W is set to the thicker width and CD is set to zero, and if Ni is on a conductor having the standard width, W is set to the standard width and CD is set to a distance from the thick part. If Ni is not on a conductor of start node 1 or on a conductor of end node 2, STF is set to a default value, L1 and L2 are set to maximum values, W is set to the standard line width of its layer, and CD (NiCD) is set to zero.

In step S31, starting point S is registered in search list M first. By this registration, the route search propagation are initiated and it is made possible to generate information about a route connected in the form of a slave node with respect to a parent node (P node). A slave node is a node neighboring parent node P. Label value L (cumulative cost from S) propagated from parent node is stored in the node which the search is propagated. In the present embodiment, two kinds of label values, L1 and L2, are stored. The propagateion of L1 is assumed at the standard via and the propagation of L2 is assumed at the redundant via where the minimum-cut rule is applied. In step S32, whether or not M is null is determined. If M is null, the procedure advances to step SP45 and the search is ended and if M is not null, the procedure advances to step S33. In step S33, one node. P with minimum label value (L) in list M is taken out. In step S34, whether P is not null (P is present) and label value L is equal to or less than the target label is determined, and if P is null and label value L is larger than the target level, this search sequence does not need to be continued and therefore the procedure advances to step S45 and the search is ended, and in other cases, the procedure advances to step S35. In step S35, one Ni is selected, which is a neighboring node of node P and not registered to M yet. In step S36, whether or not Ni is null is determined and if Ni is null, the procedure returns to step S32 and if Ni is not null, the procedure advances to step S37.

The processing contents of above steps S30 to S36 are substantially the same as those of conventional steps SP30 to SP36 in FIG. 8 except in that two label values are used, that is, label value L1 when a standard via is used and label value L2 when a redundant via is used.

In step S37, whether or not node Ni and node P are in the same layer is determined, and if they are in the same layer, the procedure advances to step S38 and if not, the procedure advances to step S50.

In step S38, cost Cli of propagation in the same layer is calculated. To calculate this, a distance a in the main direction and a distance b in the sub direction between node P and node Ni are found, a number of violations of the wiring rules e is counted, which would occur when it is assumed that node P and node Ni are connected with a standard wire width, and then the following formula is used, which is based on the cost calculation formula shown in FIG. 2.

$$Cli = a \times Dm + b \times Ds + e \times Ecost \quad (1)$$

In step S39, Cli is added to label values L1 and L2 up to node P, respectively and label values (current label) L1 and L2 when the route reaches node Ni are calculated. Then, when node Ni reaches target node T and the difference between the wire width of node Ni and the standard wire width is larger than a predetermined threshold value ΔWth of the wire width difference, which will be subject to the restriction of redundant via, and the distance over which the wire width changes from its thick part to thin part is smaller than a predetermined threshold value Dth of distance, which will be subjected to the restriction of redundant via, L2 (redundant via label value) is adopted as a label value of node P and in other cases, L1 (standard via label value) is adopted as a label value of node P.

In step S40, whether or not the current label is smaller than threshold values NiL1 and NiL2 of the scheduled label in Ni is determined and when smaller, the procedure advances to step 41 and if larger, no more route search is necessary and therefore the procedure returns to step S53.

In step S41, the label value of Ni is updated to the current label and in step S42, the parent node of Ni is updated to P. In step S43, whether or not Ni is target node T is determined and if Ni is not T, the procedure advances to step S60 in FIG. 9B and if Ni is T, it means that the route search has reached end node T, and therefore, the target label value is updated to the smaller one of label values L1, L2. At this time, Ni is stored as a node that has propagated with minimum label among a plurality of target nodes (those which have the attribute of STF==T) and the procedure returns to step S35. The node stored here corresponds to cN in S90.

In step S60 in FIG. 9B, a distance D between node P and node Ni is calculated. In step S61, W (wire width) and CD (distance from the thick part), the information of node Ni, are updated. Specifically, CD is calculated by adding the distance from node P to node Ni to the distance up to node P. If the calculated CD (distance up to node Ni) is larger than threshold value Dth, the wire width of node Ni adopts the standard wire width of the layer in which node Ni is provided, otherwise, the wire width of node P.

In step S62, node Ni is added to search list M (stored as a node to which the label has propagated) and the procedure returns to step S35. The addition of node Ni to search list M is the same as the addition of start point S.

Figure 11:
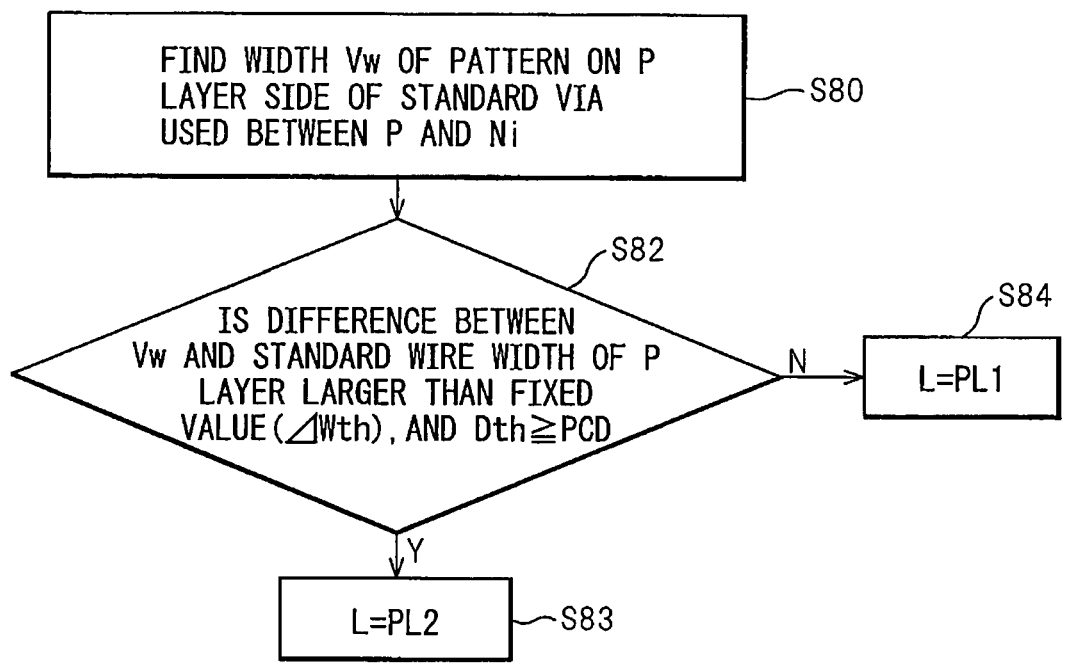
FIG. 11 is a flowchart of label determination processing.
Figure 12A:
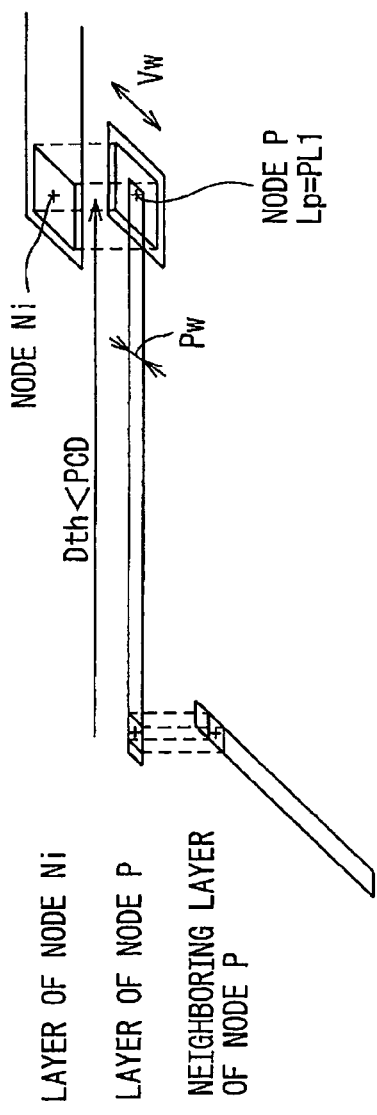
FIGS. 12A and 12B are diagrams for explaining processing of determining a via type.
Figure 12B:
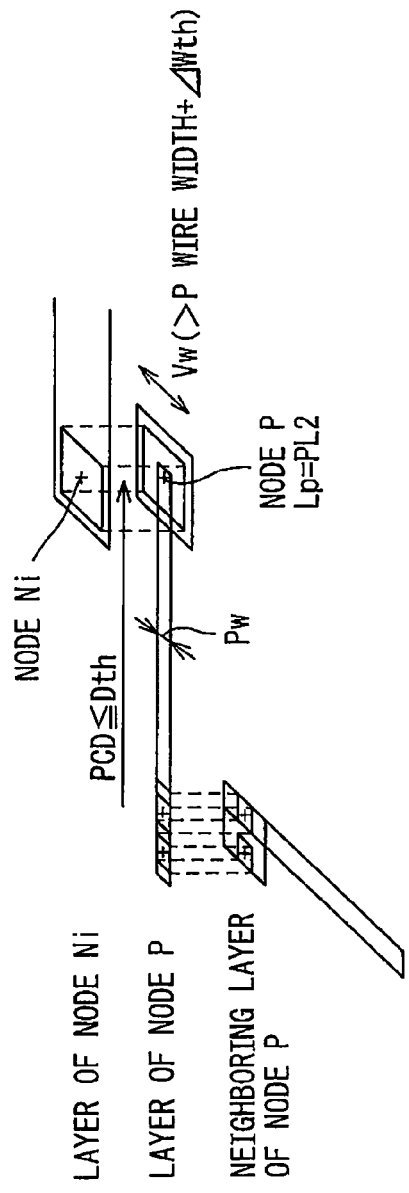

When it is determined in step S37 that node Ni and node P are in different layers, the procedure advances to step S50 shown in FIG. 9C. In step S50, label L of node P is determined by taking into consideration the redundant via rule. FIG. 11 is a flowchart showing the determination processing of label L in step S50 and FIG. 12A and FIG. 12B are diagrams for explaining the determination processing of a via type. In step S80, a via metal width Vw is found, which is a width on the side of the layer in which node P is provided of the standard via used between node P and node Ni. In step S82, it is determined whether or not the difference between Vw and a standard wire width Pw of the layer in which node P is provided is larger than predetermined threshold value ΔWth and a wire length PCD including node P is equal to or less than predetermined threshold value Dth. When these conditions are met, the procedure advances to step S83 and the value of L2 is adopted as label value L of node P and when these conditions are not met, the procedure advances to step S84 and the value of L1 is adopted as label value L of node P. FIG. 12A shows the case where these conditions are not met because wire length PCD including node P is larger than predetermined threshold value Dt and the standard via is used as a via of the route including node P and the previous layer. On the other hand, FIG. 12B shows the case where these conditions are met and the redundant via is used as a via of the route including node P and the previous layer.

In step S51, a violation cost NVe when it is assumed that the standard via is used between node P and node Ni and a violation cost RVe when it is assumed that the redundant via is used between node P and node Ni are calculated. Specifically, the number of errors en that would occur when it is assumed that the standard via is used and the number of errors er that would occur when the redundant via is used, are counted, and NVe and RVe are calculated according to the following formulas.

$$NVe = en \times Ecost$$

$$RVe = er \times Ecost$$

In step S52, a via type between node P and node Ni is determined and via propagation costs Cvi1 and Cvi2 are calculated. Specifically, when node Ni is the target node, wire width Wn on the side of node Ni is adopted as width W of the target set in the initialization processing in S30 in FIG. 9A already explained, otherwise, a standard wire width NW in the layer in which Ni is present is adopted. In this state, when wire width PW on the side of node P is equal to or less than Wn, the difference is equal to or larger than threshold value ΔWth, and minimum width Vn of the via metal on the side of node Ni is equal to or less than node P or the difference between Wn and Vn is equal to or larger than threshold value ΔWth, a redundant via is used.

When wire width PW on the side of node P is larger than Wn, and the difference is equal to or larger than ΔWth and minimum width Vp of the via metal on the side of P layer of the standard via is equal to or less than Wn, and when the difference between PW and Vp is equal to or larger than ΔWth, a redundant via is used.

In other cases, a standard via is used.

Further, as to via propagation costs Cvi1 and Cvi2, when a redundant via is used, Cvi1 is the sum of the redundant via cost and the violation cost due to the use of the redundant via and Cvi2 is the same as Cvi1, and when a standard via is used, Cvi1 is the sum of the standard via cost and the violation cost due to the use of the standard via and Cvi2 is the sum of the redundant via cost and the violation cost due to the use of the redundant via.

In step S53, the smaller value of Cvi1 and Cvi2 is added to label value L up to node P to calculate the label value (current label) when the route has reached node Ni, and then, the procedure advances to step S54.

In step S54, it is determined whether or not the current label is smaller than the label initial value of Ni or than the smaller one of NiL1 and NiL2, which are already existing label values attached at the time of the propagation of another route, and if smaller, the procedure advances to step S55 and if larger, propagation to Ni is not necessary and therefore the procedure returns to step S35.

In step S55, label values L1 and L2 of the route that has reached Ni are updated to the current labels and the parent node of Ni is updated to P in step S56. In step S57, it is determined whether or not Ni that has label-propagated right now from P is target node T, and if Ni is not T, the procedure advances to step S70 in FIG. 9D, and if Ni is T, it means that the route search has reached end node T, and therefore, the procedure advances to step S44.

Figure 9D:
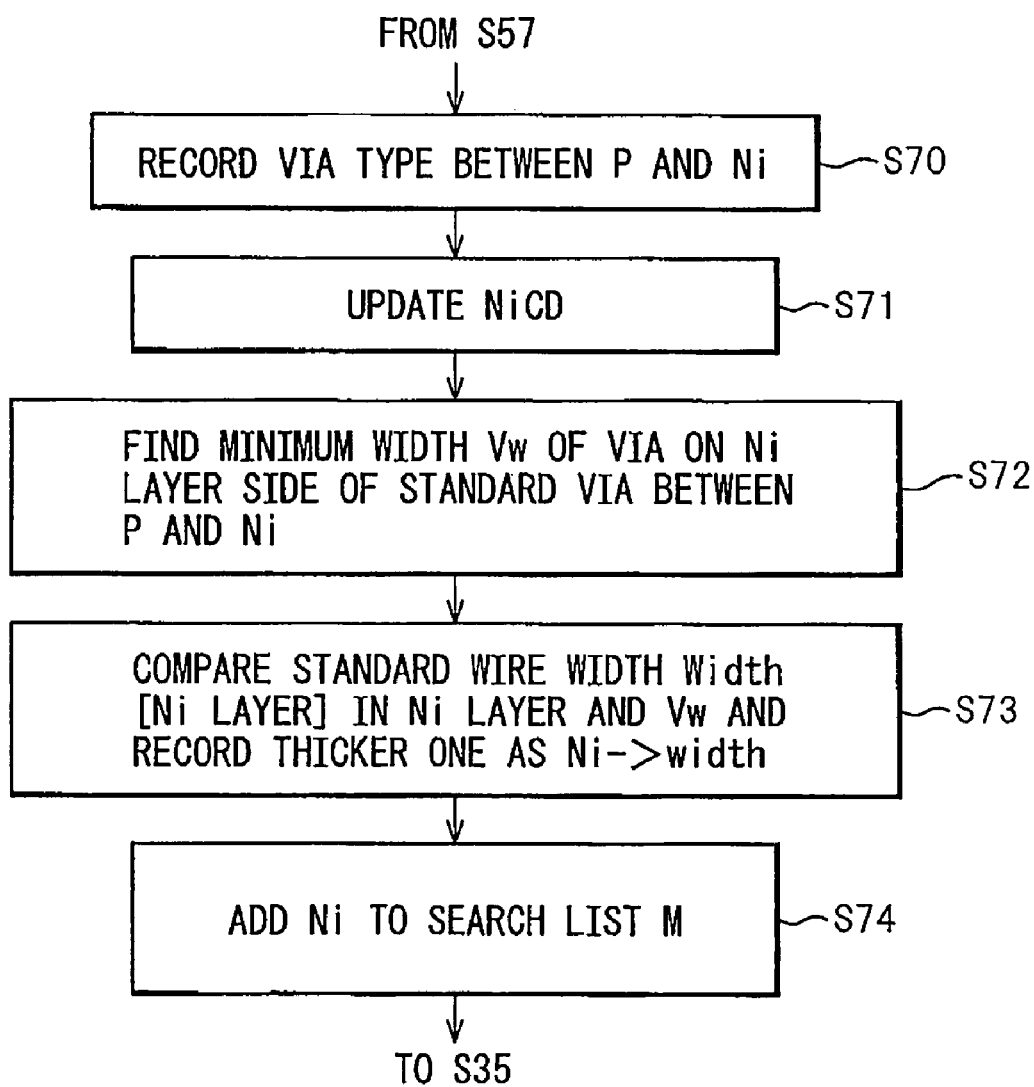

In step S70 in FIG. 9D, the via type of between node P and node Ni is recorded and in step S71, a distance NiCD from the portion from which the propagation is made to Ni in the direction of via is updated (set to zero). The distance is zero because the propagation is made from P at Ni in the direction of via. In step S72, via metal minimum width Vw is found, which is the width on the side of the layer in which node Ni of the via to be used as the standard via between node P and node Ni is present.

In step S73, standard wire width NW of the layer in which node Ni is present is compared with Vw and the thicker one is recorded as the wire width of node Ni.

In step S74, node Ni is added to search list M (stored as a node to which the label has propagated) and the procedure returns to step S35. The addition of node Ni to search list M is the same as the addition of start point S.

The minimum cost route search processing in the embodiment is explained as above, and based on the minimum cost route information obtained by the minimum cost route search processing as described above, the processing of forming a wiring route from target node T to start point S through parent node P in order is carried out in step S23 in FIG. 7. FIG. 13 is a flowchart showing the processing.

Let the node when the search route has reached target node T be cN. In step S90, the wire width of current node position cN is recorded as a current wire width and the distance from a position different from the standard wire width is recorded as CD.

In step S91, whether node cN is not null and parent node pN of node cN is not null is determined, and if at least one of them is null, the procedure is ended and if neither of them is null, the procedure advances to step S92.

In step S92, the processing differs depending on whether node cN and parent node pN are in the same layer or in different layers. If cN and pN are in the same layer, a route in the same layer is created from node cN to parent node pN, distance CD between node cN and parent node pN is added, and when CD exceeds the range of redundancy restriction, the current wire width is updated to the standard wire width. If cN and pN are in different layers, whether or not there is a mark indicating that redundant via connection is fixed, and if such a mark exists, a redundant via is used. If such a mark is not present, a difference between via metal width Vc on the side of cN of the standard via between cN and pN and the current wire width is found as ΔW, and whether or not ΔW is equal to or more than redundant via rule threshold value ΔWth and the current wire width is equal to or more than via metal width Vc, and if these conditions are met, a redundant via is created and in other case, a standard via is created. Then, the width of the layer on the side of node pN of the created via is compared with the standard wire width of the layer of pN and the thicker one is recorded as the current wire width and CD is updated to zero.

In step S93, whether or not node pN is a start node is determined, and if not a start node, the procedure advances to step S64, in which cN is updated to pN, and then the procedure returns to step S91. If node pN is a start node, the procedure is ended.

The technique disclosed above is applied to a method of automatically carrying out minimum cost route search processing in a multilayer integrated circuit, a medium that records a computer program that realizes the method, and a computer that runs the program.

I claim:

1. A method of searching for a wiring route in an integrated circuit, the method comprising:
executing via a computer processor operations of:
calculating an evaluation value for each of a plurality of wiring routes from a start node to an end node;
determining a wiring route from the start node to the end node based on the calculated evaluation value; and
storing a first evaluation value for a first via and a second evaluation value for a second via at a node between the start node and the end node,
wherein, when searching a route from a first node at a side of the start node on a first layer to a second node at a side of the end node on a second layer, one of the first evaluation value at the second node and the second evaluation value at the second node are selected based on a first wire width at the first node and a second wire width at the second node, and
wherein one of the first evaluation value at the first node and the second evaluation value at the first node is selected based on a selection result of the second node to calculate the evaluation value for the route.

2. The method of searching for a wiring route in an integrated circuit according to claim 1, wherein the via type is selected according to the distance from the via to a point at which the wire width changes and the amount of change in the wire width.

3. The method of searching for a wiring route in an integrated circuit according to in claim 2, wherein when the wire width after a via is provided exceeds a fixed wire length, the type of the via is determined.

4. The method of searching for a wiring route in an integrated circuit according to claim 1, wherein a plurality of different via types are selected according to the size of a via and the number of redundant vias.

5. An automatic wiring device for an integrated circuit, comprising:
an evaluation value calculation circuit that calculates an evaluation value of each of a plurality of wiring routes from a start node to an end node;
a determination circuit that determines a wiring route from the start node to the end node based on the calculated evaluation value; and
an evaluation value storage circuit storing a first evaluation value for a first via and a second evaluation value for a second of via add-on node between the start node and the end node,
wherein, when searching a route from a first node at a side of the start node on a first layer to a second node at a side of the end node on a second layer, one of the first evaluation value at the second node and the second evaluation value at the second node are selected based on a first wire width at the first node and a second wire width at the second node, and
wherein one of the first evaluation value at the first node and the second evaluation value at the first node is selected based on a selection result of the second node to calculate the evaluation value for the route.

6. The automatic wiring device for an integrated circuit according to claim 5, wherein the determination circuit selects the via type according to the distance from the via to a point at which the wire width changes and the amount of change in the wire width.

7. The automatic wiring device for an integrated circuit according to claim 6, wherein the determination circuit determines the type of the via when the wire width after the via is provided exceeds a fixed wire length.

8. A program to activate a wiring design device for an integrated circuit that changes a type of via to be used according to a difference between line widths of wires, the program is caused, by a computer program embodied on a computer readable storage device, to:

calculate an evaluation value for each of a plurality of wire routes from a start node to an end node;

determine a wiring route from the start node to the end node based on the calculated evaluation value; and store a first evaluation value for a first via and a second evaluation value for a second via at a node between the start node and the end node, wherein, when searching a route from a first node at a side of the start node on a first layer to a second node at a side of the end node on a second layer, one of the first evaluation value at the second node and the second evaluation value at the second node are selected based on a first wire width at the first node and a second wire width at the second node, and wherein one of the first evaluation value at the first node and the second evaluation value at the first node is selected based on a selection result of the second node to calculate the evaluation value for the route.

9. The program according to claim 8, wherein the via type is selected according to the distance from the via to a point at which the wire width changes and the amount of change in the wire width.

10. The program according to claim 9, wherein when the wire width after a via is provided exceeds a fixed wire length, the type of the via is determined.

* * * * *

UNITED STATES PATENT AND TRADEMARK OFFICE
CERTIFICATE OF CORRECTION

PATENT NO. : 7,765,510 B2
APPLICATION NO. : 12/068034
DATED : July 27, 2010
INVENTOR(S) : Ikuo Ohtsuka It is certified that error appears in the above-identified patent and that said Letters Patent is hereby corrected as shown below:

Column 12, Line 38, after "to" delete "in".

Signed and Sealed this

Seventh Day of December, 2010

David J. Kappos
*Director of the United States Patent and Trademark Office*